(12) United States Patent  
Sasaki

(10) Patent No.: US 8,933,513 B2  
(45) Date of Patent: Jan. 13, 2015

(54) SEMICONDUCTOR DEVICE

(71) Applicant: Fuji Electric Co., Ltd., Kawasaki (JP)

(72) Inventor: Osamu Sasaki, Azumino (JP)

(73) Assignee: Fuji Electric Co., Ltd. (JP)

( * ) Notice: Subject to any disclaimer, the term of this patent is extended or adjusted under 35 U.S.C. 154(b) by 59 days.

(21) Appl. No.: 13/915,663

(22) Filed: Jun. 12, 2013

(65) Prior Publication Data

US 2013/0334665 A1 Dec. 19, 2013

(30) Foreign Application Priority Data

Jun. 18, 2012 (JP) ................... 2012-136529

(51) Int. Cl.
| | |
|---|---|
| *H01L 23/62* | (2006.01) |
| *H01L 29/73* | (2006.01) |
| *H01L 27/02* | (2006.01) |
| *H01L 29/866* | (2006.01) |
| *H01L 29/732* | (2006.01) |
| *H01L 29/861* | (2006.01) |
| *H01L 29/06* | (2006.01) |

(52) U.S. Cl.
CPC ............ *H01L 29/73* (2013.01); *H01L 27/0255* (2013.01); *H01L 27/0251* (2013.01); *H01L 29/866* (2013.01); *H01L 27/0248* (2013.01); *H01L 29/732* (2013.01); *H01L 29/861* (2013.01); *H01L 29/0692* (2013.01); *H01L 27/0259* (2013.01)
USPC ............ 257/355; 257/583; 257/173; 257/362

(58) Field of Classification Search
CPC ............ H01L 27/0255; H01L 27/0259; H01L 29/866; H01L 29/861; H01L 27/0248; H01L 27/0251
See application file for complete search history.

(56) References Cited

U.S. PATENT DOCUMENTS

| | | | |
|---|---|---|---|
| 5,276,582 A | | 1/1994 | Merrill et al. |
| 5,341,005 A | * | 8/1994 | Canclini .................. 257/173 |
| 5,850,095 A | * | 12/1998 | Chen et al. ............... 257/361 |
| 2010/0230719 A1 | | 9/2010 | Sawahata |
| 2012/0038003 A1 | | 2/2012 | Kawachi |

FOREIGN PATENT DOCUMENTS

| | | |
|---|---|---|
| JP | 06-163841 A | 6/1994 |
| JP | 2005-223026 A | 8/2005 |
| JP | 2006-196487 A | 7/2006 |
| JP | 2010-239119 A | 10/2010 |
| JP | 2012-043845 A | 3/2012 |
| WO | 2012/077581 A1 | 6/2012 |

* cited by examiner

*Primary Examiner* — Fei Fei Yeung Lopez  
(74) *Attorney, Agent, or Firm* — Rossi, Kimms & McDowell LLP

(57) ABSTRACT

A semiconductor device is disclosed with a protection device formed of a parasitic bipolar transistor, a parasitic diode and a parasitic resistance and operated at a lowered operating voltage to be capable of improving a blocking capability against an over voltage. The impurity concentration in a semiconductor layer as the base of a parasitic bipolar transistor is lower compared with the impurity concentration of a semiconductor layer of the same conduction type arranged adjacently to the semiconductor layer as the base and to be the anode of a parasitic diode. The lowered impurity concentration is determined to be the concentration for making the parasitic bipolar transistor have a snapback phenomenon occur.

16 Claims, 15 Drawing Sheets

SEMICONDUCTOR DEVICE

BACKGROUND OF THE INVENTION

A. Field of the Invention

The present invention relates to a semiconductor device having a surge voltage protection device protecting the semiconductor device against a surge voltage such as an ESD (Electro-Static-Discharge).

B. Description of the Related Art

In a semiconductor device such as a power IC (integrated circuit), an ESD protection device connected to an input terminal for protecting a surge voltage is generally arranged adjacent to a pad electrode to which wire bonding is performed.

Compared with this, for decreasing a chip area, a semiconductor device is developed which has an ESD protection device arranged beneath a pad electrode. In the following, an example of a related semiconductor device will be explained which has an ESD protection device arranged beneath a pad electrode.

FIG. 8 is a cross sectional view showing the principal part of semiconductor device 500 having a related ESD protection diode. The drawing is a cross sectional view showing the principal part in the vicinity of ESD protection diode 501.

ESD protection diode 501 of semiconductor device 500 includes p-layer 152 arranged on p-type semiconductor substrate 151, LOCOS oxide films 153 arranged on p-layer 152, n-layer 154 arranged between LOCOS oxide films 153 on p-layer 152 and p-layer 155 arranged between the LOCOS oxide films 153 on p-layer 152 in a region different from the region of n-layer 154.

Moreover, ESD protection diode 501 includes insulating film 156 arranged on LOCOS oxide film 153 and on n-layer 154, contact holes 157 arranged in insulating films 156 and LOCOS oxide film 153, and pad electrode 158 arranged on insulating film 156 over n-layer 154 to make electrical contact with n-layer 154 through contact holes 157.

ESD protection diode 501 further includes metal electrode 159 arranged on insulating films 156 to make electrical contact with p-layer 155 in isolation from pad electrode 158, and passivation film 160 arranged on the surface of ESD protection diode 501 with an opening provided on pad electrode 158.

Pad electrode 158 is the cathode electrode of ESD protection diode 501 and metal electrode 159 is an anode electrode. Moreover, metal wiring is connected to the anode electrode (not shown). Furthermore, bonding wire 161 is fixed to pad electrode 158.

FIG. 9 is a diagram showing a relationship between the voltage and the current of related ESD protection diode 501. A solid line is the current to voltage characteristic curve when the size of ESD protection diode 501 is on the order of 0.5 mm×0.5 mm, for example, and a dotted line is the current to voltage characteristic curve when the size is on the order of 80 µm×80 µm, for example. In the diagram, a current rises at the avalanche voltage Vav of ESD protection diode 501. An operating resistance is represented by a reciprocal of the slope (current÷voltage) of the current to voltage characteristic curve which slope depends on a lateral resistance R in the case in which p-layer 152 and p-type semiconductor substrate 151 are combined (for the sake of convenience, in FIG. 8, the lateral resistance is shown in p-type semiconductor substrate 151).

As is shown by the solid line, by increasing the slope, a surge voltage can be effectively clamped. By clamping a surge voltage, the internal circuit (a circuit formed of a device such as a MOSFET) of semiconductor device 500 can be protected from damage due to a surge voltage.

In JP-A-6-163841, a protecting circuit is described which uses a diode, an npn bipolar transistor and a resistance. In JP-A-2005-223026, a description is given with respect to a semiconductor device in which a pad and protection device are integrated with the use of an epitaxial substrate and metal wiring to be bonded and wiring via a diode are connected to an internal circuit. In JP-A-2006-196487, there is described the formation of a protecting transistor beneath a pad. In addition, in each of JP-A-2010-239119 and JP-A-2012-43845, it is described that protecting bipolar transistors to be provided between an input terminal and the ground are formed in parallel. Further in JP-A-2010-239119, it is described that a balancing resistance is connected to each of the protecting bipolar transistors to equalize currents flowing in the protecting bipolar transistors.

In FIG. 8, a decrease in the size of ESD protection diode 501 results in a decrease in the slope of the current to voltage characteristic curve shown by the dotted line in FIG. 9. This means that an operating resistance increases to make it difficult to protect the internal circuit of semiconductor device 500 against a surge voltage.

Moreover, in FIG. 8, holes 165, produced by avalanche which occurred at the pn-junction of n-layer 154 and p-layer 152, reach p-layer 155 (contact layer) to drift toward metal electrode 159 through a region with the lateral resistance R into which region p-layer 152 and p-type semiconductor substrate 151 are combined. Since holes 165 are major carriers in p-layer 152 and p-type semiconductor substrate 151, no decrease in a resistance value due to conductivity modulation is caused. Therefore, the value of the lateral resistance R is just as the resistance value obtained from a diffusion profile of impurities and is large. Thus, the operating resistance of ESD protection diode 501 becomes relatively large. The increase in the area of n-layer 154 for decreasing the operating resistance causes the chip area to increase. The operating resistance is expressed by the reciprocal of the slope of the current to voltage characteristic curve (current/voltage) shown in FIG. 9.

ESD protection diode 501 can be used for a circuit (internal circuit) operated under an operating voltage of 5V, which circuit is fabricated by a process of the process rule of 1 µm. ESD protection diode 501, however, is difficult to apply to an internal circuit fabricated by the process rule of 1 µm or less according to a recent scaled-down IC process. Because the driving voltage of an internal circuit fabricated by the process rule of 1 µm or less is lowered to be lower than 5V.

An ESD protection diode applied to an internal circuit, fabricated by the scaled-down process and having a lowered driving voltage, necessitates a low operating voltage, which requires lowering the reverse breakdown voltage of the ESD protection diode.

For lowering the reverse breakdown voltage of the ESD protection diode, the impurity concentration in a drift layer (p-layer 152) is generally increased. This, however, increases a leak current at a high temperature. Thus, it is difficult to lower the reverse breakdown voltage of the ESD protection diode.

In JP-A-2010-239119, it is described that for simultaneously conducting a plurality of protecting bipolar transistors formed in the semiconductor device, a balancing resistance is provided for each of the protecting bipolar transistors. This, however, increases the occupied area of the ESD protection device to increase the chip area. Moreover, the scattering in the values of the balancing resistances causes currents to concentrate into one protecting bipolar transistor to make the ESD protection device liable to be damaged.

Also in JP-A-2010-239119, a configuration is described in which the protecting bipolar transistors are operated to protect the internal circuit when a high voltage such as an ESD surge is applied. However, no description is presented with respect to the lowered operating voltage of the ESD protection device to cope with the lowered driving voltage of the internal circuit associated with a scaled-down IC process.

Moreover, in each of JP-A-6-163841, JP-A-2005-223026, JP-A-2006-196487, JP-A-2010-239119 and JP-A-2012-43845, there is no description with respect to a configuration of decreasing the impurity concentration in the semiconductor layer, which is to be the base of the parasitic bipolar transistor, to be lower compared with the impurity concentration in the semiconductor layer to be the anode of the parasitic diode. In addition, there is no description with respect to a configuration of decreasing the operating resistance of an ESD protection device by forming the protecting device with a combination of a large number of parasitic npn transistors and a large number of parasitic diodes to make the parasitic npn transistors have snapbacks occur in order and turned-on.

It is an object of the invention to solve the foregoing problems and provide a semiconductor device provided with a protection device with a low operation voltage.

SUMMARY OF THE INVENTION

A semiconductor device according to a first aspect of the invention is a semiconductor device including: a first semiconductor layer of a first conduction type; a second semiconductor layer of a second conduction type arranged on the first semiconductor layer; a third semiconductor layer of the first conduction type arranged on the second semiconductor layer; a fourth semiconductor layer of the first conduction type arranged on the second semiconductor layer adjacently to the third semiconductor layer, the fourth semiconductor layer having an impurity concentration lower than the impurity concentration of the third semiconductor layer; a fifth semiconductor layer of the second conduction type arranged so as to extend from the region on the third semiconductor layer to the region on the fourth semiconductor layer; a first metal electrode electrically connected to the fifth semiconductor layer; and a second metal electrode electrically connected to the first semiconductor layer, the second semiconductor layer, the third semiconductor layer and the fourth semiconductor layer, the semiconductor device being made to have a configuration in which the fifth semiconductor layer, the fourth semiconductor layer and the second semiconductor layer form a parasitic bipolar transistor, the fifth semiconductor layer and the third semiconductor layer form a parasitic diode with the breakdown voltage thereof being provided to be lower than the breakdown voltage of the parasitic bipolar transistor, at least the second semiconductor layer and the third semiconductor layer form parasitic resistances, and the parasitic diode, the parasitic bipolar transistor and the parasitic resistances form a protection device, in which a reverse current of the parasitic diode, having a breakdown voltage lower than the breakdown voltage of the parasitic bipolar transistor, brings the parasitic bipolar transistor into conduction by the occurrence of a snapback.

A semiconductor device according to a second aspect of the invention is, in the first aspect, made to have a configuration in which the fifth semiconductor layer has an insulating film arranged thereon which film has a plurality of contact holes, and the first metal electrode is arranged on the insulating film so as to be electrically connected to the fifth semiconductor layer through a plurality of the contact holes.

A semiconductor device according to a third aspect of the invention is, in the first aspect or in the second aspect, made to have a configuration in which a plurality of the third semiconductor layers each to be the anode of the parasitic diode and a plurality of the fourth semiconductor layers each to be the base of the parasitic bipolar transistor are alternately and adjacently arranged to make a plurality of the parasitic diodes and a plurality of the parasitic bipolar transistors alternately and adjacently arranged, by which the third semiconductor layer and the fourth semiconductor layer become the base resistance of the parasitic bipolar transistor in the rear stage to make the parasitic bipolar transistors arranged which are brought into conduction by snapbacks occurring in order.

A semiconductor device according to a fourth aspect of the invention is, in the third aspect, made to have a configuration in which in each of the third semiconductor layer and the fourth semiconductor layer, a ratio of the lateral width to the diffusion depth is in the range from 2 to 20.

A semiconductor device according to a fifth aspect of the invention is, in the first aspect or the second aspect, made to have a configuration in which the impurity concentration of the fourth semiconductor layer is an impurity concentration making the parasitic bipolar transistor have a snapback phenomenon occur.

A semiconductor device according to a sixth aspect of the invention is, in the first aspect or the second aspect, made to have a configuration in which the impurity concentration of the fourth semiconductor layer is an impurity concentration making the parasitic bipolar transistor have a snapback phenomenon occur.

A semiconductor device according to a seventh aspect of the invention is, in the first aspect or the second aspect, made to have a configuration in which the fourth semiconductor layer is adjacently surrounded by the third semiconductor layer having a ring-like plane shape while being in contact with the third semiconductor layer.

A semiconductor device according to an eighth aspect of the invention is, in the first aspect or the second aspect, made to have a configuration in which a plurality of the third semiconductor layers, each having a ring-like plane shape, and a plurality of the fourth semiconductor layers, each having a ring-like plane shape and being surrounded by the third semiconductor layer while being in contact therewith, are alternately arranged repeatedly.

A semiconductor device according to a ninth aspect of the invention is, in the eighth aspect, made to have a configuration in which the number of the repetition is in the range from one to ten.

For actualizing the semiconductor device described in the foregoing, the protection device is formed of a parasitic bipolar transistor, a parasitic diode and a parasitic resistance (lateral resistance).

With the impurity concentration in the fourth semiconductor layer as the base of the parasitic bipolar transistor made to be lower compared with the impurity concentration of the third semiconductor layer to be the anode of the parasitic diode, the lowered concentration is determined to be the concentration of making the parasitic bipolar transistor have a snapback phenomenon occur. With the parasitic transistor made to have a snapback occur to be brought into conduction, the operating resistance of the protecting device can be lowered to make it possible to bring the operating voltage to be low.

Moreover, by increasing the impurity concentration in the third semiconductor layer to be the anode of the parasitic diode, the breakdown voltage (Zener voltage) of the parasitic diode is lowered to lower the operating voltage of the protecting device.

Furthermore, by forming a protecting device with a plurality of the parasitic bipolar transistors and a plurality of the parasitic diodes alternately and adjacently formed, the operation resistance of the protecting device is made to be further lower to bring the operating voltage to be further low.

According to the invention, a semiconductor device provided with a protecting device with a low operating voltage can be provided.

Moreover, a semiconductor device capable of improving a blocking capability against an over voltage can be provided.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Example to be Compared

As an example of a configuration for solving the foregoing problem, the configuration of an example of a semiconductor device to be compared will be explained in the following. Here, the sign "n" in the explanation represents that the conductivity is the n-type and the sign "p" in the explanation represents that the conductivity is the p-type.

Figure 5A:
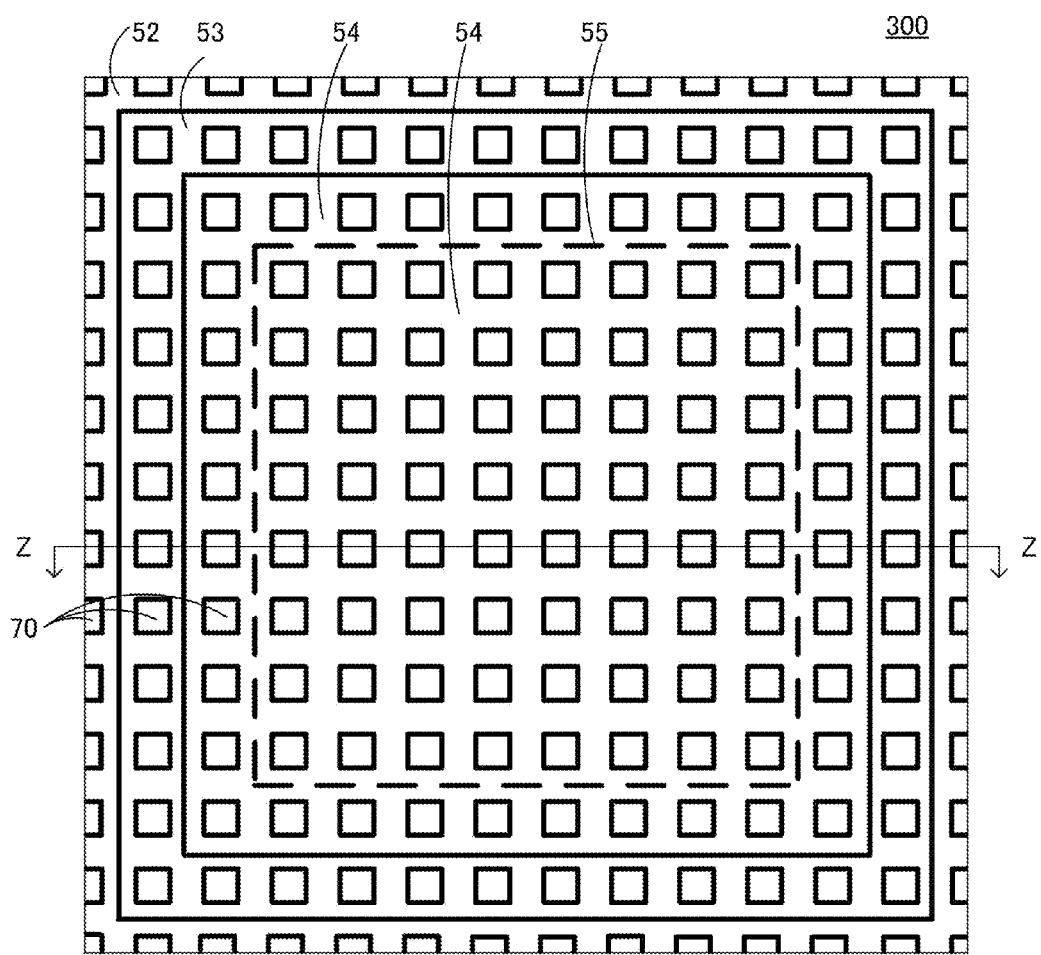
FIG. 5A is a plan view showing the configuration of the principal part of a semiconductor device as an example to be compared.
Figure 5B:
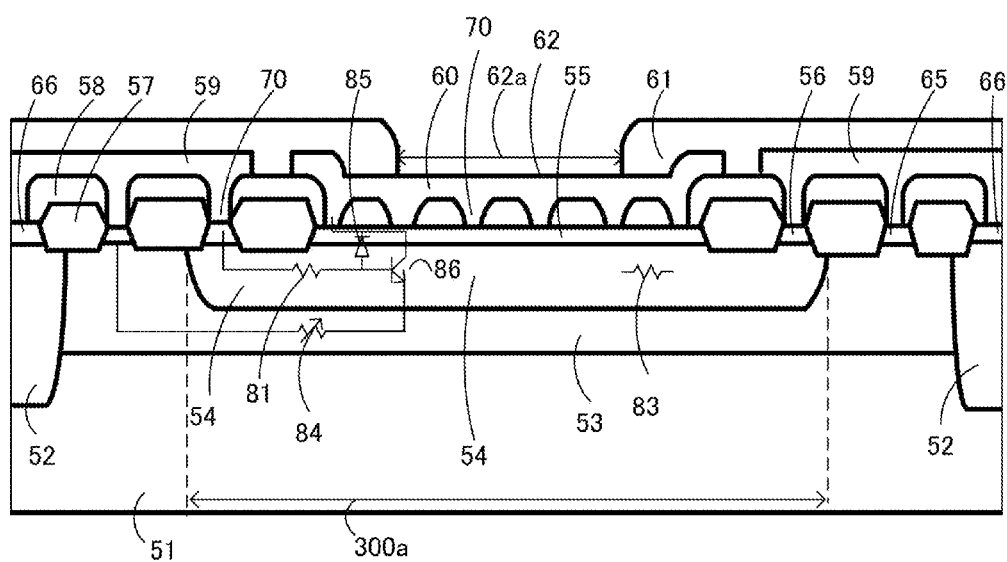
FIG. 5B is a cross sectional view showing the principal part cut along the line Z-Z of FIG. 5A.

FIG. 5A is a plan view showing the configuration of a principal part of semiconductor device 300 as an example to be compared and FIG. 5B is a cross sectional view showing the principal part cut along the line Z-Z of FIG. 5A.

In p-type semiconductor substrate 51, p$^-$-well layer 52 and n$^-$-well layer 53 are formed. In n$^-$-well layer 53, p-base layer 54 is formed on the surface layer of which n$^+$-layer 55 is formed which becomes the cathode of parasitic diode 85 and the collector of parasitic npn transistor 86. On the surface layer of p-base layer 54, p$^+$-layer 56 is further formed which becomes the contact section of p-base layer 54.

Moreover, on the contact sections of p$^-$-well layer 52 and n$^-$-well layer 53, p$^+$-layer 66 and n$^+$-layer 65 are formed, respectively, and insulating film 58 is formed so as to cover thick oxide film 57. Furthermore, wiring is provided with anode metal wiring 59 and cathode metal wiring 60, on which passivation film 61 is formed with opening 62a for providing cathode metal wiring 60 as pad electrode 62 for bonding.

Anode metal wiring 59 is provided so that the potentials of semiconductor substrate 51, the p$^-$-well layer 52 and the n$^-$-well layer 53 become equipotential.

Figure 6A:
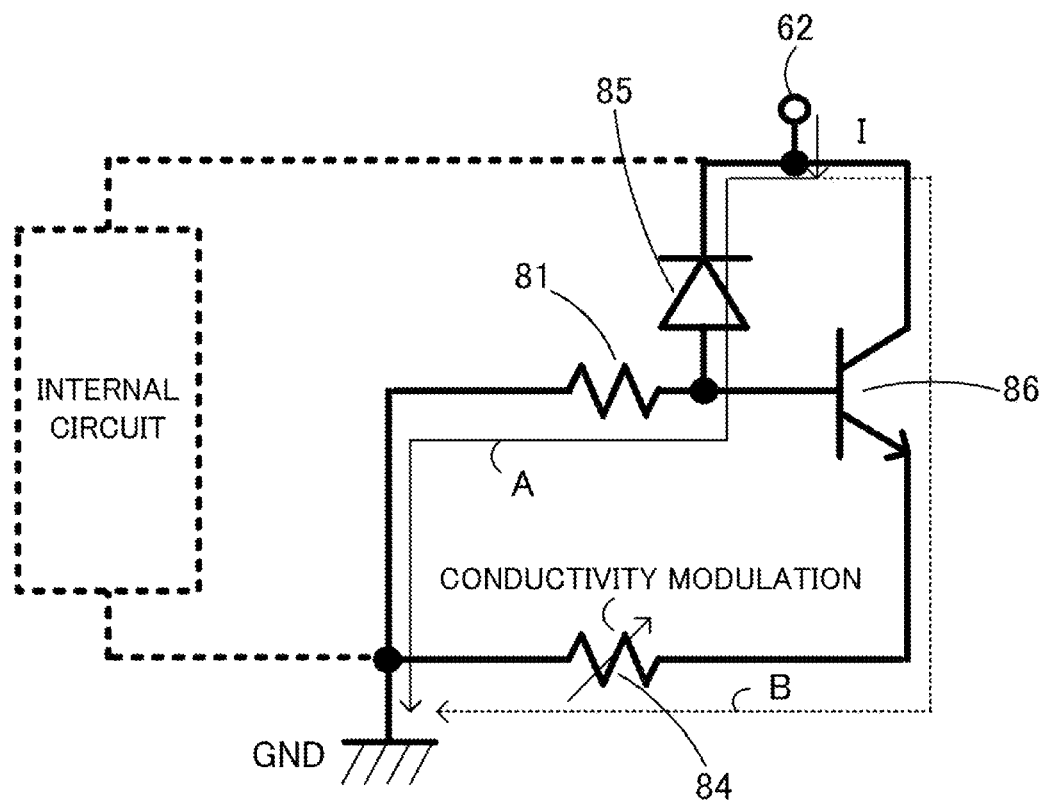
FIG. 6A is a circuit diagram showing an equivalent circuit illustrating the operation of the semiconductor device shown in FIGS. 5A and 5B.
Figure 6B:
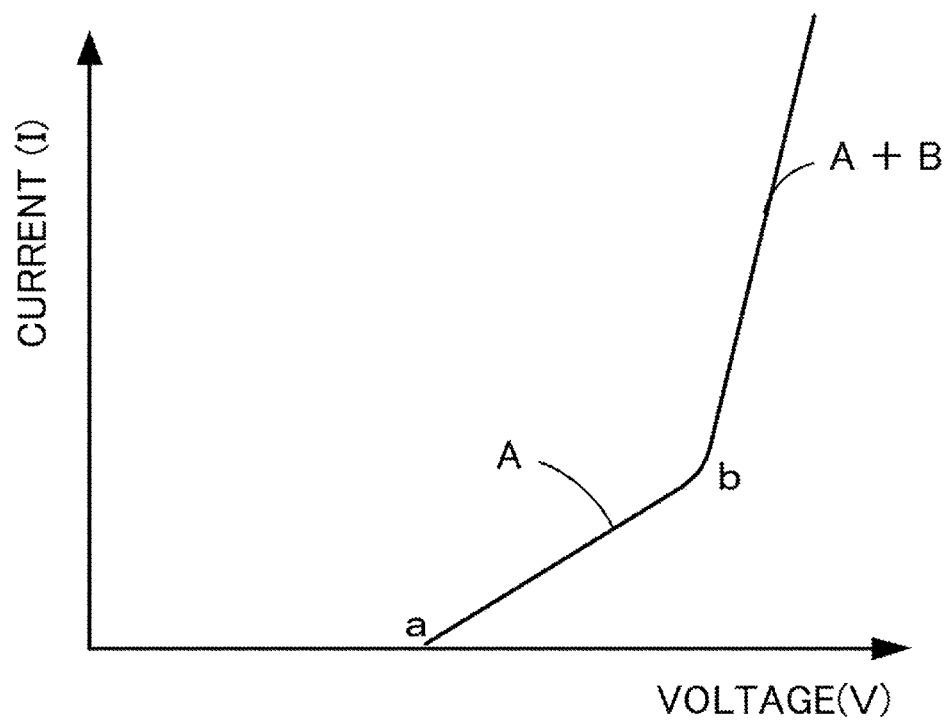
FIG. 6B is a diagram illustrating an I-V characteristic of the semiconductor device shown in FIGS. 5A and 5B.

FIGS. 6A and 6B are diagrams for explaining the operation and a current to voltage (I-V) characteristic of semiconductor device 300 shown in FIGS. 5A and 5B, with FIG. 6A being an equivalent circuit diagram and FIG. 6B being an I-V characteristic diagram. In FIG. 6B, the vertical axis represents a current I and the horizontal axis represents a voltage V.

Figure 7:
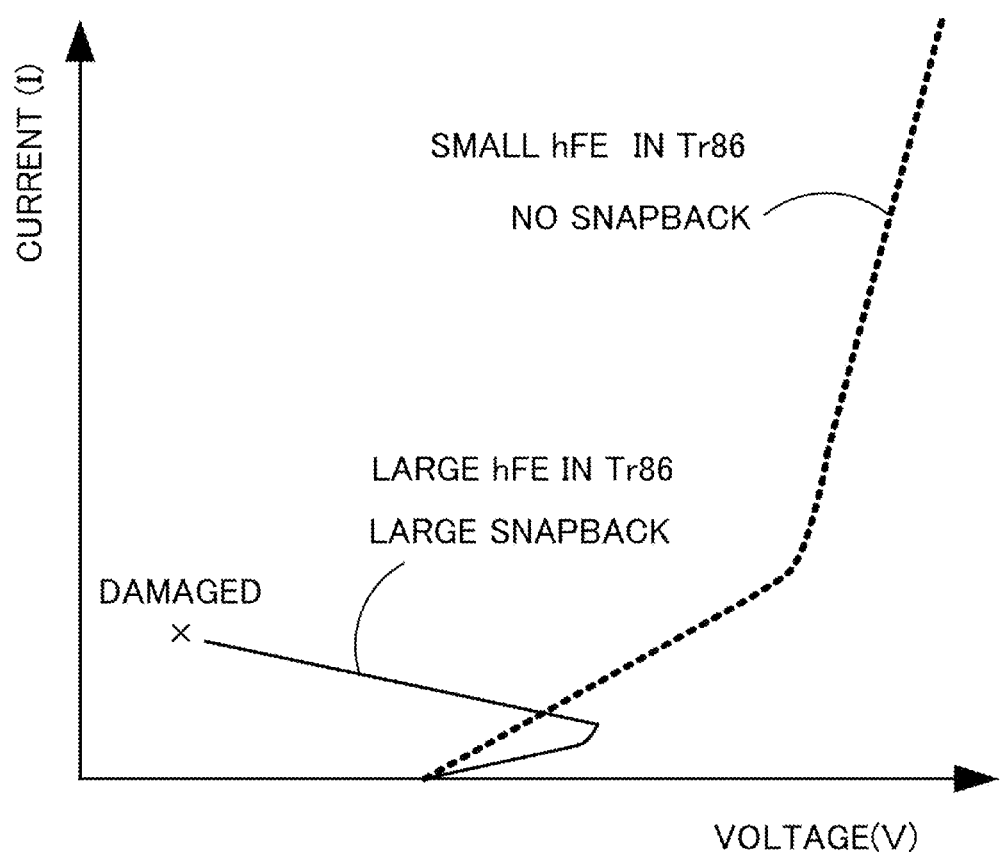
FIG. 7 is an I-V characteristic diagram showing a state in which a parasitic npn transistor with an excessively increased hFE is damaged at the instant of the occurrence of a snapback in the semiconductor device shown in FIGS. 5A and 5B.
Figure 8:
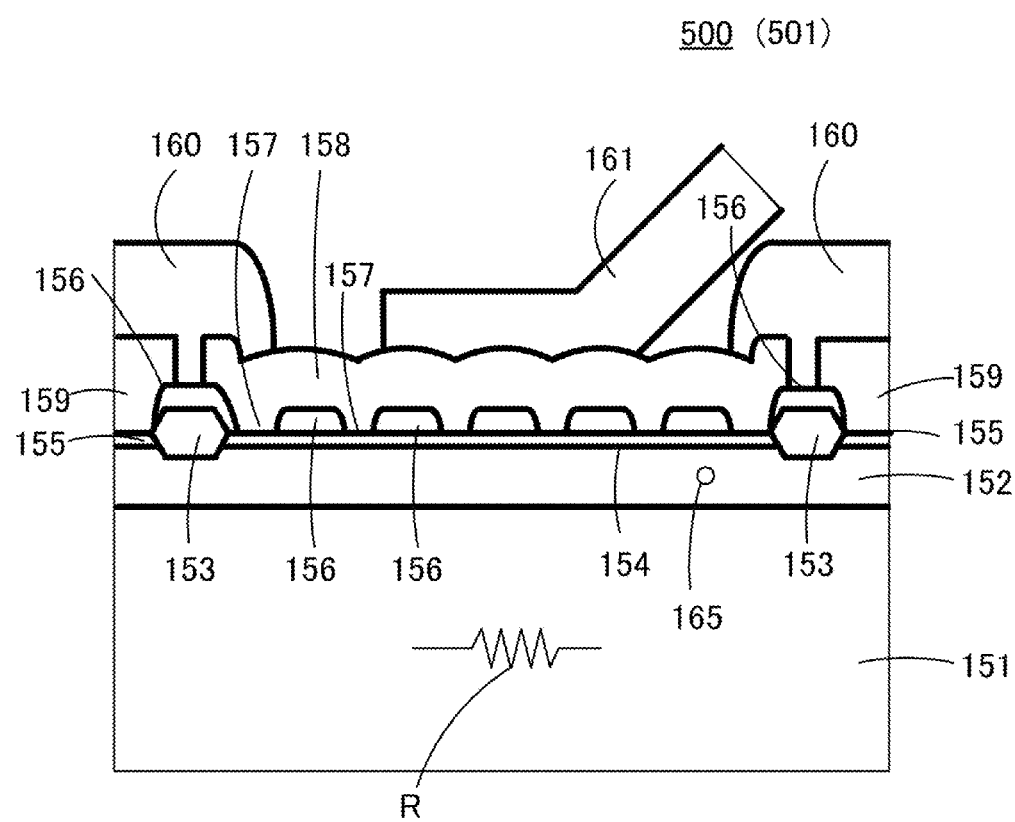
FIG. 8 is a cross sectional view showing the principal part of a semiconductor device having a related ESD protection diode.
Figure 9:
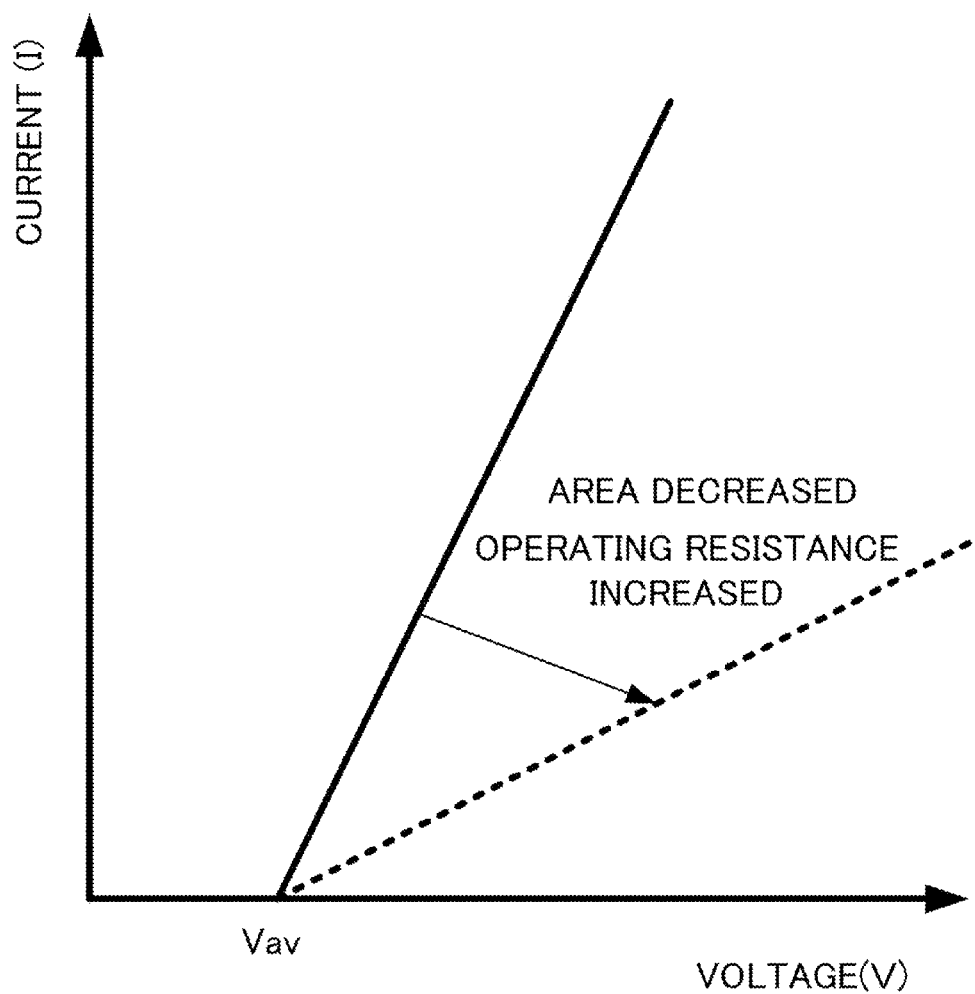
FIG. 9 is a diagram showing a relationship between the voltage and the current of the related ESD protection diode.

FIG. 7 is an I-V characteristic diagram showing a state in which parasitic npn transistor 86 with an excessively increased hFE is damaged at the instant of the occurrence of a snapback in semiconductor device 300 shown in FIGS. 5A and 5B.

The operation of ESD protection device 300a formed in semiconductor device 300 shown in FIGS. 5A and 5B will be explained by using the equivalent circuit shown in FIG. 6A and the I-V characteristic diagram shown in FIG. 6B. ESD protection device 300a is formed of parasitic diode 85, parasitic npn transistor 86 and lateral resistances 81 (83) and 84 as parasitic resistances.

The application of an ESD surge to pad electrode 62 exposed from opening 62a increases the voltage of pad electrode 62. When the increased voltage exceeds the Zener voltage (point a in FIG. 6B) of parasitic diode 85, a current "A" flows to the ground GND along the path of parasitic diode 85 and lateral resistance 81 as a parasitic resistance. When the voltage produced across lateral resistance 81 reaches 0.6V to 0.7V (point b), parasitic npn transistor 86 starts operation by which a current "B" flows along a path of parasitic npn transistor 86 and lateral resistance 84 as a parasitic resistance to be superimposed on the current "A". Further increase in the current flowing in parasitic npn transistor 86 also increases the voltage (in a period in which the current "A"+"B" flows). The slope of the I-V characteristic curve (reciprocal of I/V) becomes an operating resistance. In the period, holes are injected from p-base layer 54 of parasitic npn transistor 86 to the n$^-$-well layer 53 as an n-emitter layer, by which a conductivity modulation occurs in lateral resistance 84 in n$^-$-well layer 53 as the n-emitter layer to considerably lower the resistance value of lateral resistance 84 from the original resistance value.

The operating resistance lowered by increasing the slope explained in the foregoing can suppress an increase in the voltage applied to the internal circuit even though an ESD surge is applied to semiconductor device 300.

In the semiconductor device as an example to be compared, however, although the operating resistance of ESD protection device 300a as an ESD protection npn transistor is lowered, the voltage level in the I-V characteristic is not necessarily lowered sufficiently for being applied to the internal circuit with a lowered operating voltage. Therefore, to further lower the voltage V in the I-V characteristic, there is a configuration with which the common emitter forward current gain hFE of parasitic npn transistor 86 is increased to make parasitic npn transistor 86 have a snapback phenomenon occur. However, as is shown in FIG. 7, an excessively increased hFE of parasitic npn transistor 86 results in the damage of parasitic npn transistor 86 at the instant of the occurrence of a snapback.

Furthermore, when the impurity concentration in p-base layer 54 is decreased (when the value of lateral resistance 83 is increased) for increasing hFE of parasitic npn transistor 86, the base current in the middle section of pad electrode 62 decreases to cause the current to concentrate into the peripheral section of pad electrode 62 to result in the damage of parasitic npn transistor 86.

In addition, since the operating voltage of the internal circuit is lower in association with a scale-down in the IC process, it is necessary to lower the breakdown voltage (Zener voltage) of parasitic diode 85 forming ESD protection device 300a (the ESD protection npn transistor). To lower the breakdown voltage of parasitic diode 85, it is necessary to increase the impurity concentration in p-base layer 54. The increase in the impurity concentration in p-base layer 54, however, causes an increase in a leak current of p-base layer 54, which increases a loss of ESD protection device 300a. Moreover, the efficiency in electron injection from the collector ($n^+$-layer 55) to the base (p-base layer 54) of parasitic npn transistor 86 is lowered to lower the hFE of parasitic npn transistor 86. As a result, the slope (I/V) of the I-V characteristic curve shown in FIG. 6 is decreased, which increases the operating resistance of ESD protection device 300a. The increased operating resistance causes an excessive voltage to be applied to a gate oxide film of a MOSFET forming the internal circuit, by which the gate oxide film is broken. Therefore, it is difficult for the semiconductor device in the example to be compared to be applied to an internal circuit formed in a scaled-down process so as to have a lowered operating voltage.

As was described in the foregoing, in order to lower the breakdown voltage of parasitic diode 85, it is necessary to increase the impurity concentration in p-base layer 54. The increase in the impurity concentration, however, increases a leak current of parasitic diode 85 at the operation at a high temperature. Moreover, as was described in the foregoing, the increase in hFE by increasing lateral resistance 83 with the decrease in the impurity concentration causes a problem of damaging parasitic npn transistor 86 by an excessive current at the instant of the occurrence of the snapback of parasitic npn transistor 86. For preventing this, the adjustable range of the impurity concentration of p-base layer 54 must be considerably narrowed, by which it becomes difficult to share p-base layer 54 with other devices by providing p-base layer 54 as the p-type diffusion layers thereof.

Next, explanations will be made with respect to a configuration in which a voltage of the I-V characteristic is lowered while parasitic npn transistor 86 forming ESD protection device 300a is prevented from being damaged by the occurrence of a snapback. Specifically, p-base layer 54 is formed of two kinds of regions of a low impurity concentration region and a high impurity concentration region so that the whole region beneath pad electrode 62 is effectively operated, by which the operation resistance of parasitic npn transistor 86 is lowered. This lowers the operating voltage of ESD protection device 300a to provide a configuration of preventing an ESD surge from being applied to the internal circuit. With respect to the configuration, explanations will be made by the following examples of the invention.

Example 1

Figure 1A:
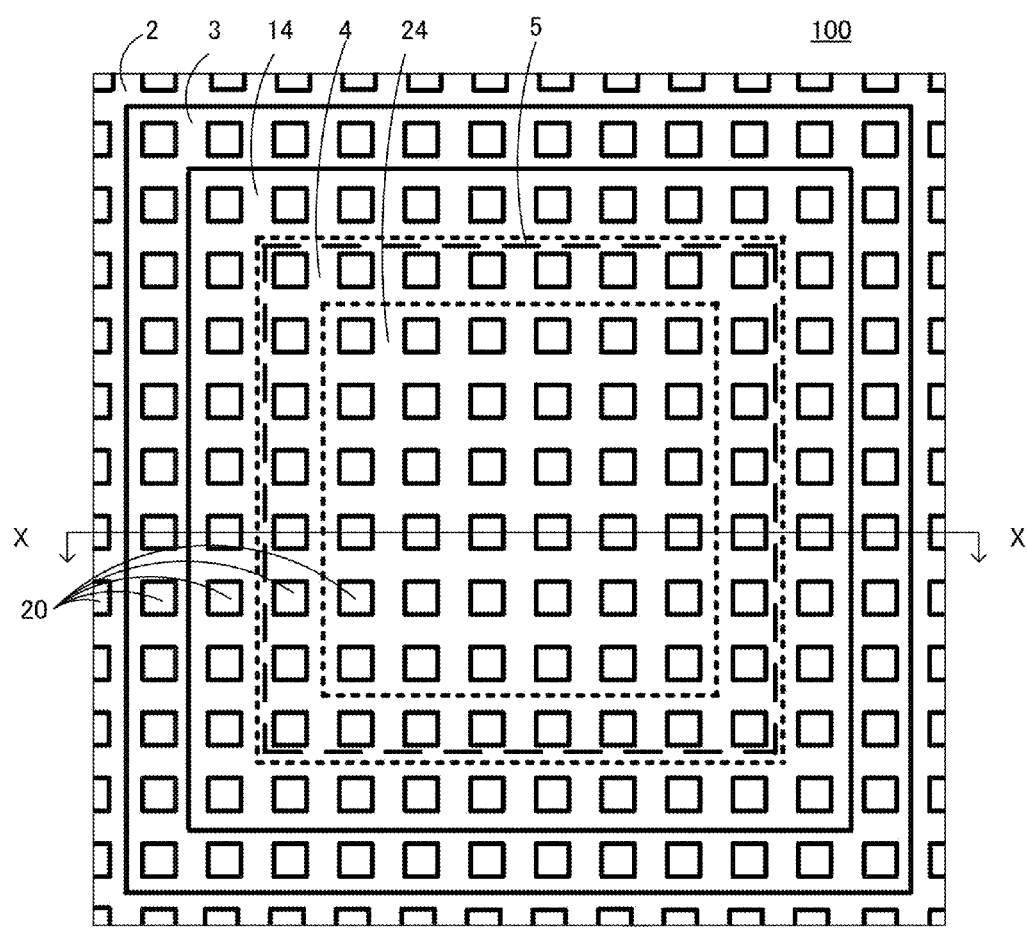
FIG. 1A is a plan view showing the configuration of the principal part of a semiconductor device according to an example 1 of the invention.
Figure 1B:
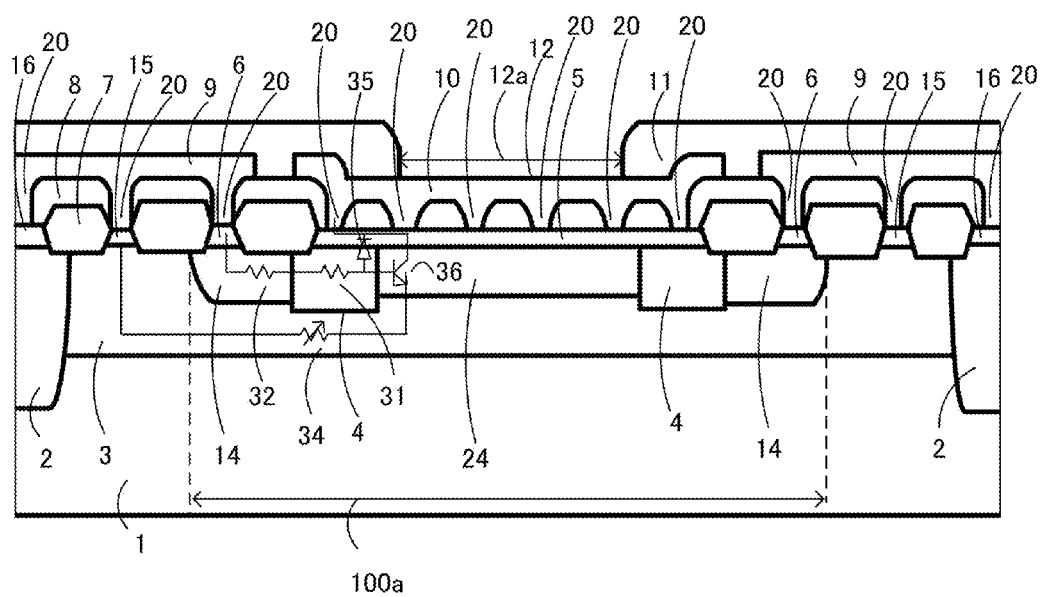
FIG. 1B is a cross sectional view showing the principal part cut along the line X-X of FIG. 1A.

FIG. 1A is a plan view showing the configuration of a principal part of semiconductor device 100 according to an Example 1 of the invention and FIG. 1B is a cross sectional view showing the principal part cut along the line X-X of FIG. 1A.

In a p-type semiconductor substrate 1, $p^-$-well layer 2 and $n^-$-well layer 3 (the emitter of a parasitic npn transistor) are formed. On the surface layer of $n^-$-well layer 3, p-base layer 4 (the anode of a parasitic diode), p-base layer 24 (the base of the parasitic npn transistor) and p-base layer 14 are formed. P-base layer 4 is formed between p-base layer 14 and p-base layer 24 so as to isolate p-base layer 14 from p-base layer 24. On the surface layers of p-base layer 4 and p-base layer 24, $n^+$-layer 5 (the collector of the parasitic npn transistor) is formed and on the surface layer of p-base layer 14, $p^+$-layer 6 to be contact section 20 is formed. Reference numeral 32 in the drawing designates lateral resistance of p-base layer 14. The parasitic npn transistor is an npn type parasitic bipolar transistor.

On the surface layers of $p^-$-well layer 2 and $n^-$-well layer 3, $p^+$-layer 16 and $n^+$-layer 15 are formed, respectively, each to be contact section 20. Moreover, on $p^-$-well layer 2 and $n^-$-well layer 3, thick oxide film (LOCOS) 7 is formed on which insulating film 8 is formed so as to cover thick oxide film 7. To $p^+$-layer 6, $n^+$-layer 15 and $p^+$-layer 16, anode metal wiring 9 (also serves as a gate metal wiring of parasitic npn transistor 36) is connected and to $n^+$-layer 5, cathode metal wiring 10 (also serves as a collector metal wiring of parasitic npn transistor 36) is connected. Over anode metal wiring 9 and cathode metal wiring 10, passivation film 11 is formed so as to have opening 12a at the central section. Cathode metal wiring 10 in opening 12a becomes pad electrode 12 for wire bonding.

Anode metal wiring 9 is provided so that the potentials of p-type semiconductor substrate 1, $p^-$-well layer 2, $n^-$-well layer 3 and p-base layer 14 become equipotential.

Moreover, as shown in FIGS. 1A and 1B, p-base layer 24 to be the base of parasitic npn transistor 36 (parasitic bipolar transistor) is arranged in the central section and p-base layer 4 to be the anode of parasitic diode 35 is arranged around parasitic npn transistor 36 as a ring.

The reverse breakdown voltage (Zener voltage) of parasitic diode 35 forming ESD protection device 100a is adjusted by adjusting the impurity concentration and the diffusion depth of p-base layer 4. Moreover, the resistance values of lateral resistances 31 and 32 to be the base resistance of parasitic npn transistor 36 are adjusted by adjusting the impurity concentrations and the diffusion depths of p-base layers 14 and 4. The hFE of parasitic npn transistor 36 is adjusted by adjusting the impurity concentration and the diffusion depth of p-base layer 24.

Figure 2A:
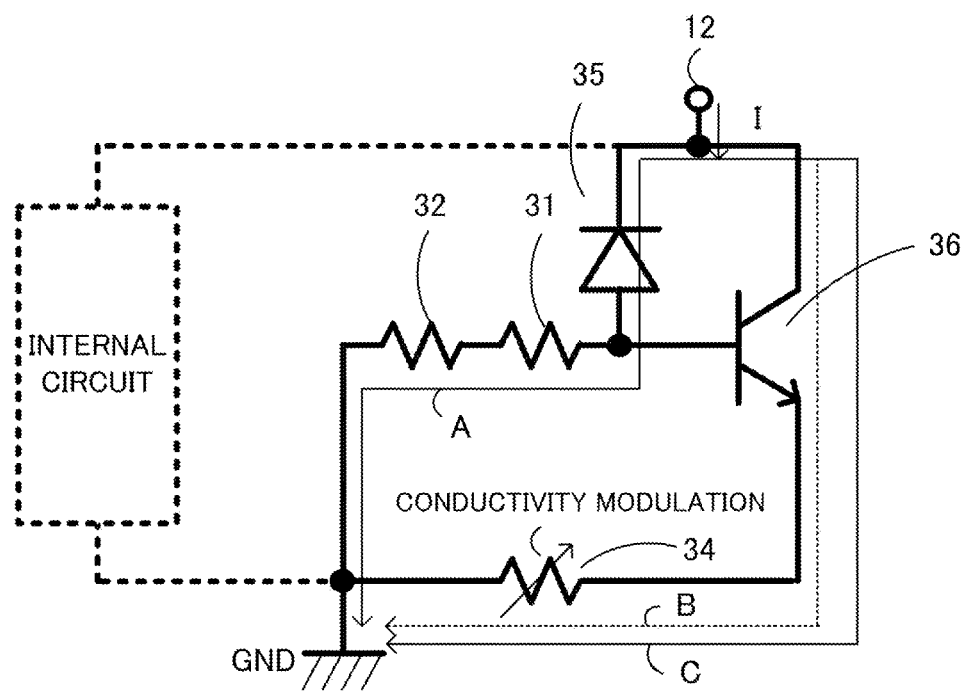
FIG. 2A is a circuit diagram showing an equivalent circuit illustrating the operation of the semiconductor device shown in FIGS. 1A and 1B.
Figure 2B:
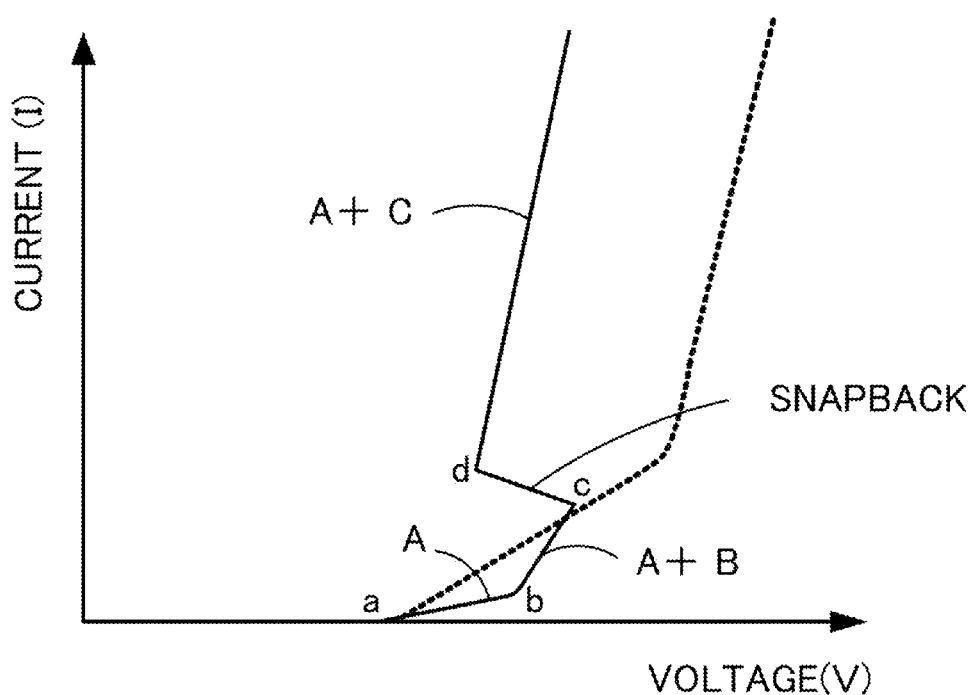
FIG. 2B is a diagram illustrating an I-V characteristic of the semiconductor device shown in FIGS. 1A and 1B.

FIGS. 2A and 2B are diagrams for explaining the operation and a current to voltage (I-V) characteristic of semiconductor device 100 shown in FIGS. 1A and 1B, with FIG. 2A being an equivalent circuit diagram and FIG. 2B being an I-V characteristic diagram. The equivalent circuit diagram shown in FIG. 2A is equivalent to the equivalent circuit shown in FIG. 6A. Moreover, in the I-V characteristic diagram shown in FIG. 2B, the I-V characteristic of the example to be compared shown in FIG. 6B is also shown by a dotted line. In FIG. 2B, the vertical axis represents a current I and the horizontal axis represents a voltage V.

The operation of ESD protection device 100a formed in semiconductor device 100 shown in FIGS. 1A and 1B will be explained by using the equivalent circuit shown in FIG. 2A and the I-V characteristic diagram shown in FIG. 2B. ESD protection device 100a is formed of parasitic diode 35, parasitic npn transistor 36 and lateral resistances 31, 32 and 34 as parasitic resistances.

The application of an ESD surge to pad electrode 12 increases the voltage of pad electrode 12. When the increased voltage exceeds the Zener voltage (point a in FIG. 2B) of parasitic diode 35, a current "A" flows to the ground GND along the path of parasitic diode 35 and lateral resistance 31 and lateral resistance 32 as parasitic resistances (a period in which the current "A" flows). When the voltage produced across lateral resistance 31 and lateral resistance 32 reaches 0.6V to 0.7V (point b), parasitic npn transistor 36 starts an operation by which a current "B" flows from parasitic npn transistor 36 along a path of lateral resistor 34 as a parasitic resistor to be superimposed on the current "A" (a period in which the sum of the currents "A"+"B" flows). When an increase in the current flowing in parasitic npn transistor 36 increases the hFE of parasitic npn transistor 36 (point c), snapback of parasitic npn transistor 36 occurs to lower the voltage of ESD protection device 100a to a point d. Further increase in the current flowing in parasitic diode 35 and parasitic npn transistor 36 gradually increases the voltage of ESD protection device 100a from the voltage (point d) after the occurrence of the snapback of parasitic npn transistor 36 (a period in which the sum of the currents "A"+"C" flows). In the period, a large amount of holes are injected from p-base layer 24 of parasitic npn transistor 36 to $n^-$-well layer 3 (emitter layer), by which conductivity modulation occurs in lateral resistance 34 of $n^-$-well layer 3 to considerably lower the resistance value of lateral resistance 34 from the original value. The voltage of ESD protection device 100a after the occurrence of the snapback (point d) becomes considerably lower compared with the voltage of ESD protection device 300a of the example to be compared shown by the dotted line.

In the equivalent circuit shown in FIG. 2A, by increasing the resistance values of lateral resistances 31 and 32, the base current of parasitic npn transistor 36 is lowered. Moreover, by adjusting the impurity concentration and the diffusion depth in p-base layer 24, the value of hFE of parasitic npn transistor 36 is determined at the optimum value to make a snapback phenomenon occur to lower the voltage after parasitic npn transistor 36 is operated (after the occurrence of the snapback). As a result, even though an ESD surge is applied, an increase in the voltage applied to the internal circuit can be suppressed.

The value of the hFE of parasitic npn transistor 36 is preferably determined to be within the range from 1 to 5. The hFE less than 1 makes no snapback occur as is shown in the example to be compared, while hFE exceeding 5 causes a current concentration in the transistor at the instant of the occurrence of a snapback to result in the damage of parasitic npn transistor 36. Thus, the value of the hFE is preferably determined to be between 2 and 3.

Moreover, the impurity concentration in p-base layer 24 of parasitic npn transistor 36 is well determined to be between $1 \times 10^{16}$ cm$^{-3}$ and $1 \times 10^{18}$ cm$^{-3}$. The impurity concentration is further preferably determined to be around $1 \times 10^{17}$ cm$^{-3}$.

As was described in the foregoing, the respective impurity concentrations in p-base layer 4 and p-base layer 24 can be determined independently. Thus, p-base layers 4 and 24 and p-layers of the other devices can be formed simultaneously. Moreover, p-base layer 14 is sometimes formed simultaneously with p-base layer 24. In this case, the manufacturing process is simplified, by which the manufacturing cost can be decreased. However, lateral resistance 32 of p-base layer 14 is increased to increase the operation resistance of ESD protection device 100a.

In addition, by forming ESD protection device 100a (a parasitic npn transistor and a parasitic diode) beneath pad electrode 12, pad electrode 12 is effectively used to permit the chip area to be reduced.

By decreasing the values of the impurity concentration and the diffusion depth of parasitic npn transistor 36 to the optimum values, a snapback phenomenon occurs without damaging the parasitic npn transistor as was described in the foregoing, which can suppress the voltage low which is shown by the I-V characteristic after the occurrence of the snapback.

As was described in the foregoing, with the impurity concentration of p-base layer 4 to be the anode layer of parasitic diode 35 increased and with the impurity concentration of p-base layer 24 to be the base of parasitic npn bipolar transistor 36 controlled to such a low value that a snapback phenomenon occurs without damaging the transistor, the two p-base layers 4 and 24 with the impurity concentrations thereof different from each other are arranged so that p-base layer 24 is in the central section and p-base layer 4 is around p-base layer 24. This lowers the reverse breakdown voltage of parasitic diode 35 to make the operation of ESD protection device 100a start at a low voltage and makes parasitic npn transistor 36 have a snapback occur at a specified voltage. As a result, the slope of the I-V characteristic curve of ESD protection device 100a increases to permit the operating resistance of ESD protection device 100a to be lowered. Moreover, the operating voltage of ESD protection device 100a can be lowered to permit the ESD blocking capability of the semiconductor device to be improved.

However, since the voltage V after the occurrence of the snapback described in the foregoing gradually increases with an increase in the current I, it is desirable to further enhance the protecting function by ESD protection device 100a against an ESD surge.

Now explanations will be made with respect to a semiconductor device which minimize the voltage difference between immediately before and immediately after the occurrence of the snapback to enable the value of the voltage at the operation of an ESD protection device to be kept at a further lower value.

Example 2

Figure 3A:
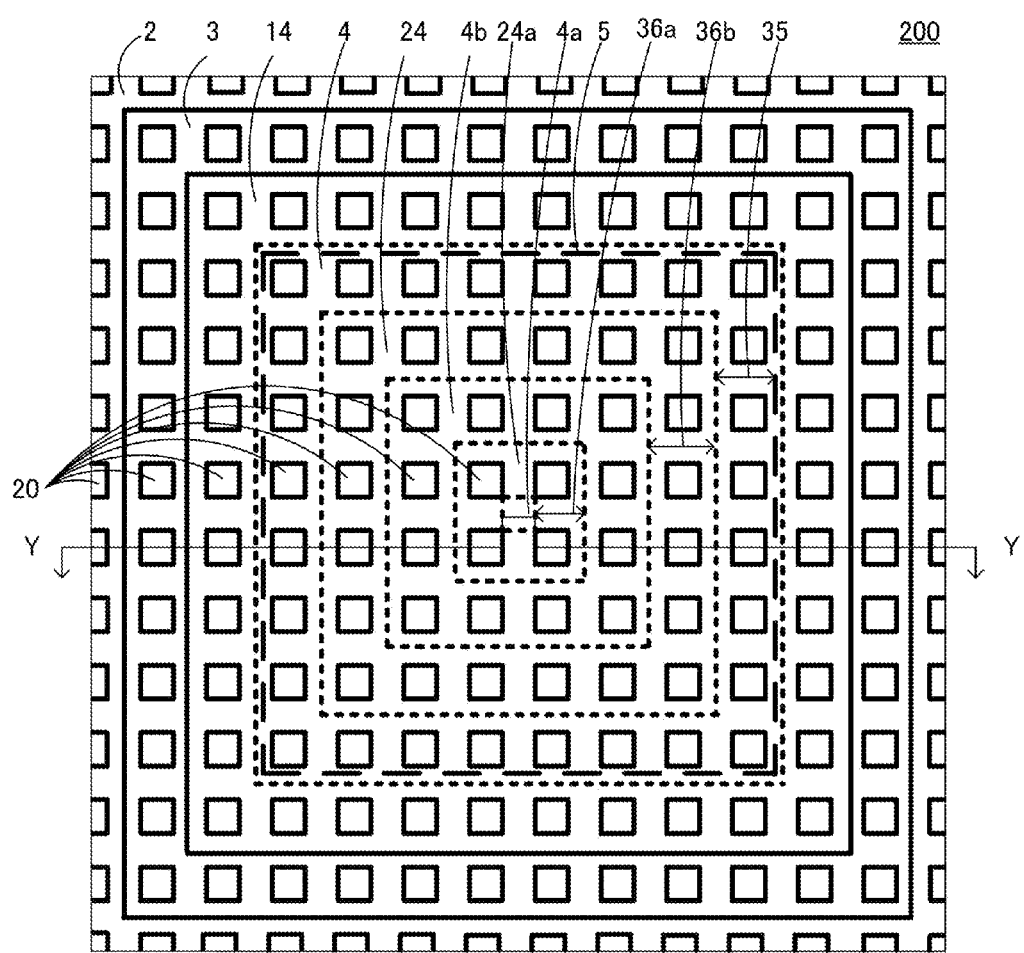
FIG. 3A is a plan view showing the configuration of the principal part of a semiconductor device according to an example 2 of the invention.
Figure 3B:
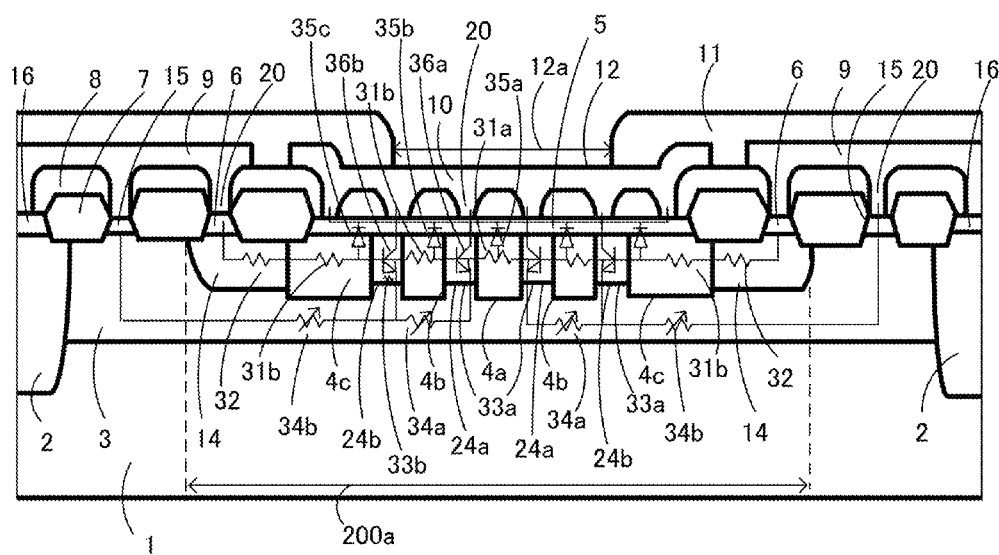
FIG. 3B is a cross sectional view showing the principal part cut along the line Y-Y of FIG. 3A.

FIG. 3A is a plan view showing the configuration of the principal part of semiconductor device 200 according to an Example 2 of the invention and FIG. 3B is a cross sectional view showing the principal part cut along the line Y-Y of FIG. 3A.

Semiconductor device 200 shown in FIGS. 3A and 3B differs from semiconductor device 100 shown in FIGS. 1A and 1B in that a plurality of p-base layers 4 (4a, 4b and 4c) and a plurality of p-base layers 24 (24a and 24b) are alternately formed. FIGS. 3A and 3B show the case in which p-base layer 4 (4a) is arranged at the center, around which p-base layers 24 and p-base layers 4 are alternately arranged in a ring in order as 24a, 4b, 24b and 4c to thereby provide two ring-like parasitic npn transistors 36 (36a and 36b). Also in this case, as was explained in the description of the Example 1, p-base layer 14 and p-base layer 24 are sometimes formed at the same time.

In the configuration shown in FIGS. 3A and 3B, the operation starting currents of the two parasitic npn transistors 36a and 36b are different from each other. Thus, two snapbacks separately occur one after the other at a low voltage, a voltage difference between immediately before and immediately after the occurrence of a snapback is small. Furthermore, the configuration provides an I-V characteristic with which a voltage V is kept at a low value to a current I increasing to a large value. This can provides ESD protection device 200a with a low breakdown voltage. As a result, the internal circuit with a low breakdown voltage in semiconductor device 200 can be protected against an ESD surge without damaging parasitic npn transistor 36 forming ESD protection device 200a.

With the two kinds of p-base layers 4 and p-base layers 24 alternately formed in this way, p-base layers 4 as the anodes of parasitic diodes 35 (35a, 35b and 35c) are made to have high impurity concentrations and p-base layers 24 as the bases of parasitic npn transistors 36 are made to have low impurity concentrations. This increases the value of the hFE of each of parasitic npn transistors 36 to a proper value with the Zener voltage of each of parasitic diodes 35 being lowered to lower the voltage across semiconductor device 200 after the occurrence of the snapback while preventing parasitic npn transistor 36 from being damaged, by which the internal circuit with a low breakdown voltage can be surely protected against an ESD surge.

In FIG. 3B, lateral resistances 33 in a plurality of p-base layers 24 arranged in the lateral direction are added to parasitic npn transistors 36 as their respective base resistances. The value of each of lateral resistances 33 is adjusted by adjusting the impurity concentration, the diffusion depth and the lateral width of each of lateral resistances 33.

Figure 4A:
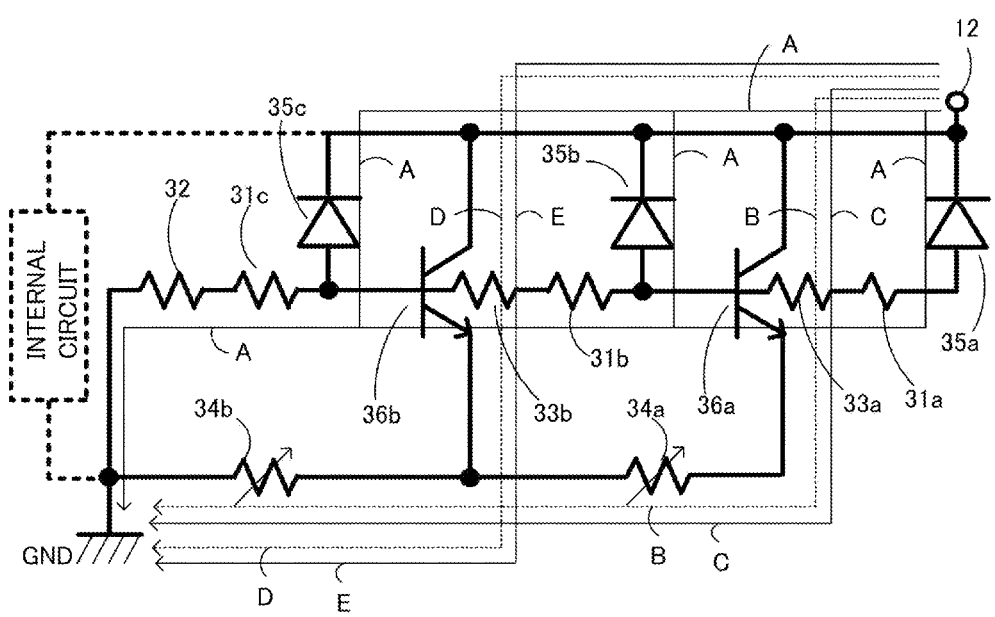
FIG. 4A is a circuit diagram showing an equivalent circuit illustrating the operation of the semiconductor device shown in FIGS. 3A and 3B.
Figure 4B:
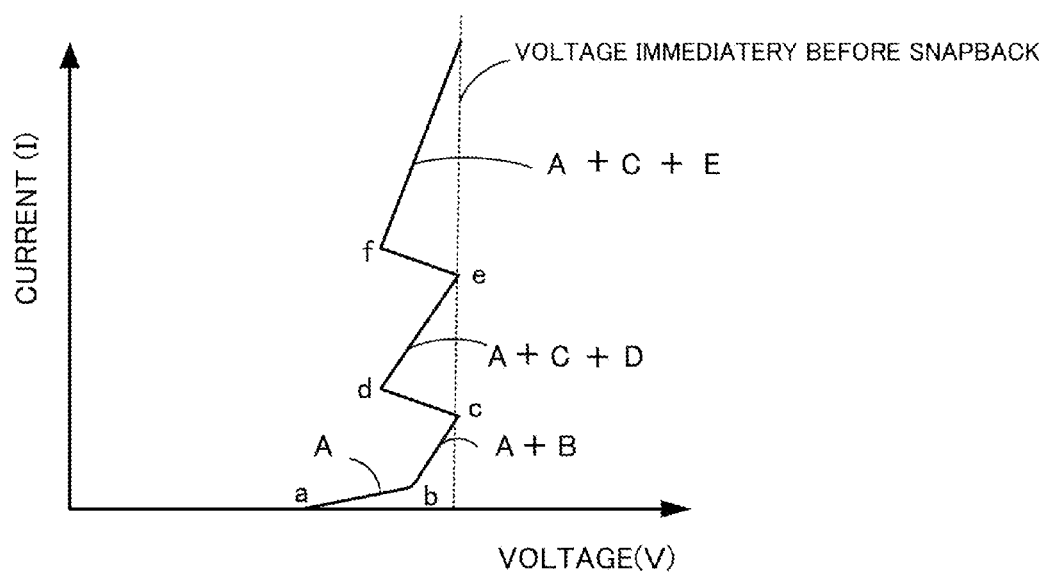
FIG. 4B is a diagram illustrating an I-V characteristic of the semiconductor device shown in FIGS. 3A and 3B.

FIGS. 4A and 4B are diagrams for explaining the operation and a current to voltage (I-V) characteristic of semiconductor device 200 shown in FIGS. 3A and 3B, with FIG. 4A being an equivalent circuit diagram and FIG. 4B being an I-V characteristic diagram. The equivalent circuit diagram shown in FIG. 4A corresponds to the equivalent circuit shown in FIG. 2A. The I-V characteristic diagram shown in FIG. 4B corresponds to the I-V characteristic diagram shown in FIG. 2B.

The operation of ESD protection device 200a formed in semiconductor device 200 shown in FIGS. 3A and 3B will be explained by using the equivalent circuit shown in FIG. 4A and the I-V characteristic diagram shown in FIG. 4B.

The application of an ESD surge to pad electrode 12 increases the voltage of pad electrode 12. When the increased voltage exceeds the Zener voltage (point "a" in FIG. 4B) of each of parasitic diode 35a, 35b and 35c, a current "A" flows to the ground GND along the path of parasitic diodes 35a, 35b and 35c and lateral resistances 31a, 33a, 31b, 33b, 31c and 32 as parasitic resistances (a period in which the current "A" flows). When the voltage produced across lateral resistances 31a, 33a, 31b, 33b, 31c and 32 reaches 0.6V to 0.7V (point "b"), parasitic npn transistor 36a at the rightmost position in FIG. 4A starts an operation by which a current "B" flows along a path of parasitic npn transistor 36a and lateral resistances 34a and 34b as parasitic resistances to be superimposed on the current "A" (a period in which the sum of the currents "A"+"B" flows). When an increase in the current flowing in parasitic npn transistor 36a at the rightmost position in FIG. 4A increases the hFE of parasitic npn transistor 36a (point "c"), a snapback of parasitic npn transistor 36a occurs to lower the voltage of ESD protection device 200a down to a point "d". Further increase in the current, flowing in parasitic diode 35a at the rightmost position in FIG. 4A and parasitic npn transistor 36a, gradually increases the voltage of ESD protection device 200a (formed of all of parasitic diodes 35a, 35b and 35c and all of parasitic npn transistors 36a and 36b) from the voltage (point "d") after the occurrence of the snapback of parasitic npn transistor 36a at the rightmost position in FIG. 4A, by which a current flows also in the adjacent parasitic npn transistor 36b (a period in which the sum of the currents "A"+"C"+"D" flows). The increase in the hFE of parasitic npn transistor 36b (point "e"), makes parasitic npn transistor 36b have a snapback occur to lower the voltage of ESD protection device 200a down to a point "f". Further increase in the current, flowing in parasitic diode 35 and parasitic npn transistor 36, gradually increases the voltage of ESD protection device 200a from the voltage (point "f") after the occurrence of the snapback of parasitic npn transistor 36b (a period in which the sum of the currents "A"+"C"+"E" flows).

Further increase in the number of the stages of parasitic npn transistors 36 makes the occurrence of the snapback repeat to thereby increase the current while the voltage repeating increase and decrease. This, while making the voltage V in the I-V characteristic slightly fluctuate, increases only the current I with little increase in the voltage V immediately before the occurrence of snapback (the voltage at the point where the vertical dotted line connecting the point "c" and the point "e" intersects the horizontal axis). Therefore, the voltage across ESD protection device 200a when an ESD surge is inputted thereto is reduced to a low voltage, by which the internal circuit with a low breakdown voltage in semiconductor device 200 can be protected against an ESD surge.

By increasing the number of parasitic npn transistors 36 arranged in parallel, snapbacks occur by the number of parasitic npn transistors 36 arranged in parallel to provide the advantage of suppressing the voltage increase in the internal circuit.

Moreover, the effectiveness of the number of the stages of parasitic npn transistors 36 arranged in parallel is exhibited from one stage. However, the number of the stages more than ten exhibits no change in the voltage V in the I-V characteristic shown by the dotted line despite the increase in the number of the stages, which weakens the effectiveness.

Moreover, each of the ratio of the lateral width W1 of p-base layer 4 to the diffusion depth T1 (W1/T1) in p-base layer 4 with a high impurity concentration and the ratio of the lateral width W2 to the diffusion depth T2 (W2/T2) in p-base layer 24 with a high impurity concentration determined to be in the range from 2 to 20 makes a snapback phenomenon occur, which exhibits the effect of providing multistage parasitic npn transistors 36. A ratio smaller than this range, however, provides too small an area of parasitic npn transistors 36, resulting in insufficient operations of parasitic npn transistors 36 and lessening the effect of providing multistage parasitic npn transistors 36. A ratio exceeding the range increases the voltage immediately before the occurrence of the snapback of an adjacent parasitic npn transistor 36, which degrades the protecting function against an ESD surge.

As is shown in FIGS. 3A and 3B, by arranging a plurality of parasitic npn transistors 36 in parallel in a ring-like fashion over the entire region beneath pad electrode 12, snapbacks occur in order from parasitic npn transistor 36 arranged in the central section beneath pad electrode 12 toward parasitic npn transistor 36 arranged in the peripheral section. Snapbacks of parasitic npn transistors 36 occurring in order make parasitic npn transistors 36 in the whole region beneath pad electrode 12 so as to be brought into operation. By distributing snapbacks so as to occur in order in this way, the voltage immediately before the occurrence of a snapback is reduced to be low to make it possible to make a voltage V in the I-V characteristic after the occurrence of a snapback so as to be approximately constant at a low voltage even though the current I increases. As a result, ESD protection device 200a itself is prevented from being damaged, by which the internal circuit with a low breakdown voltage in semiconductor device 200 can be protected against an ESD surge.

In the examples in the foregoing, explanations were made with respect to semiconductor devices each having the ESD protection device formed beneath pad electrode 12. The invention, however, is not limited to this but a device having the ESD protection device not formed beneath the pad electrode can also provide the advantages of the invention.

While the present invention has been particularly shown and described with reference to the preferred embodiment thereof, it will be understood by those skilled in the art that the foregoing and other changes in form and details can be made therein without departing from the spirit and scope of the present invention.

Thus, a semiconductor has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device comprising:
   a first semiconductor layer of a first conduction type;
   a second semiconductor layer of a second conduction type arranged on the first semiconductor layer;
   a third semiconductor layer of the first conduction type arranged on the second semiconductor layer;
   a fourth semiconductor layer of the first conduction type arranged on the second semiconductor layer adjacent to the third semiconductor layer, the fourth semiconductor layer having an impurity concentration lower than the impurity concentration of the third semiconductor layer;
   a fifth semiconductor layer of the second conduction type which extends from the region on the third semiconductor layer to the region on the fourth semiconductor layer;
   a first metal electrode electrically connected to the fifth semiconductor layer; and
   a second metal electrode electrically connected to the first semiconductor layer, the second semiconductor layer, the third semiconductor layer and the fourth semiconductor layer,
   the fifth semiconductor layer, the fourth semiconductor layer and the second semiconductor layer forming a parasitic bipolar transistor,
   the fifth semiconductor layer and the third semiconductor layer forming a parasitic diode with the breakdown voltage thereof being lower than the breakdown voltage of the parasitic bipolar transistor,
   at least the second semiconductor layer and the third semiconductor layer forming parasitic resistances, and
   the parasitic diode, the parasitic bipolar transistor and the parasitic resistances forming a protection device, in which a reverse current of the parasitic diode, having a breakdown voltage lower than the breakdown voltage of the parasitic bipolar transistor, brings the parasitic bipolar transistor into conduction by the occurrence of a snapback.

2. The semiconductor device as claimed in claim 1, wherein the fifth semiconductor layer has an insulating film arranged thereon, which film has a plurality of contact holes, and the first metal electrode is arranged on the insulating film so as to be electrically connected to the fifth semiconductor layer through a plurality of the contact holes.

3. The semiconductor device as claimed in claim 1, wherein a plurality of the third semiconductor layers each to be the anode of the parasitic diode and a plurality of the fourth semiconductor layers each to be the base of the parasitic bipolar transistor are alternately and adjacently arranged to make a plurality of the parasitic diodes and a plurality of the parasitic bipolar transistors alternately and adjacently arranged, by which the third semiconductor layer and the fourth semiconductor layer become the base resistance of the parasitic bipolar transistor in the rear stage to make the parasitic bipolar transistors arranged which are brought into conduction by snapbacks occurring in order.

4. The semiconductor device as claimed in claim 2, wherein a plurality of the third semiconductor layers each to be the anode of the parasitic diode and a plurality of the fourth semiconductor layers each to be the base of the parasitic bipolar transistor are alternately and adjacently arranged to make a plurality of the parasitic diodes and a plurality of the parasitic bipolar transistors alternately and adjacently arranged, by which the third semiconductor layer and the fourth semiconductor layer become the base resistance of the parasitic bipolar transistor in the rear stage to make the parasitic bipolar transistors arranged which are brought into conduction by snapbacks occurring in order.

5. The semiconductor device as claimed in claim 3, wherein in each of the third semiconductor layer and the fourth semiconductor layer, a ratio of the lateral width to the diffusion depth is in the range from 2 to 20.

6. The semiconductor device as claimed in claim 4, wherein in each of the third semiconductor layer and the fourth semiconductor layer, a ratio of the lateral width to the diffusion depth is in the range from 2 to 20.

7. The semiconductor device as claimed in claim 1, wherein the parasitic resistance formed of at least the third semiconductor layer becomes the base resistance of the parasitic bipolar transistor.

8. The semiconductor device as claimed in claim 2, wherein the parasitic resistance formed of at least the third semiconductor layer becomes the base resistance of the parasitic bipolar transistor.

9. The semiconductor device as claimed in claim 1, wherein the impurity concentration of the fourth semiconductor layer is an impurity concentration making the parasitic bipolar transistor have a snapback phenomenon occur.

10. The semiconductor device as claimed in claim 2, wherein the impurity concentration of the fourth semiconductor layer is an impurity concentration making the parasitic bipolar transistor have a snapback phenomenon occur.

11. The semiconductor device as claimed in claim 1, wherein the fourth semiconductor layer is adjacently surrounded by the third semiconductor layer having a ring-like plane shape while being in contact with the third semiconductor layer.

12. The semiconductor device as claimed in claim 2, wherein the fourth semiconductor layer is adjacently surrounded by the third semiconductor layer having a ring-like plane shape while being in contact with the third semiconductor layer.

13. The semiconductor device as claimed in claim 1, wherein a plurality of the third semiconductor layers, each having a ring-like plane shape, and a plurality of the fourth semiconductor layers, each having a ring-like plane shape and being surrounded by the third semiconductor layer while being in contact therewith, are alternately arranged repeatedly.

14. The semiconductor device as claimed in claim 2, wherein a plurality of the third semiconductor layers, each having a ring-like plane shape, and a plurality of the fourth semiconductor layers, each having a ring-like plane shape and being surrounded by the third semiconductor layer while being in contact therewith, are alternately arranged repeatedly.

15. The semiconductor device as claimed in claim 13, wherein the number of repeats is in the range from one to ten.

16. The semiconductor device as claimed in claim 14, wherein the number of repeats is in the range from one to ten.

* * * * *